(12) United States Patent
Yeung et al.

(10) Patent No.: US 9,069,652 B2
(45) Date of Patent: Jun. 30, 2015

(54) INTEGRATED LEVEL SHIFTING LATCH CIRCUIT AND METHOD OF OPERATION OF SUCH A LATCH CIRCUIT

(71) Applicant: ARM LIMITED, Cambridge (GB)

(72) Inventors: Gus Yeung, Austin, TX (US); Bo Zheng, Cupertino, CA (US); Frank Guo, Danville, CA (US)

(73) Assignee: ARM Limited, Cambridge (GB)

( * ) Notice: Subject to any disclaimer, the term of this patent is extended or adjusted under 35 U.S.C. 154(b) by 158 days.

(21) Appl. No.: 13/782,077

(22) Filed: Mar. 1, 2013

(65) Prior Publication Data

US 2014/0250278 A1  Sep. 4, 2014

(51) Int. Cl.
| | |
|---|---|
| G11C 7/00 | (2006.01) |
| G06F 12/00 | (2006.01) |
| G11C 5/14 | (2006.01) |
| G11C 11/417 | (2006.01) |
| G11C 7/10 | (2006.01) |

(52) U.S. Cl.
CPC ............... *G06F 12/00* (2013.01); *G11C 5/147* (2013.01); *G11C 7/1039* (2013.01); *G11C 7/1057* (2013.01); *G11C 7/106* (2013.01); *G11C 7/1084* (2013.01); *G11C 7/1087* (2013.01); *G11C 11/417* (2013.01)

(58) Field of Classification Search
CPC ............ G11C 7/065; G11C 7/22; G11C 8/08; G11C 2207/104; G11C 2207/229
USPC ............. 365/189.11, 189.08, 189.16, 189.12, 365/205, 228; 327/74, 333; 326/63, 68, 80, 326/81
See application file for complete search history.

(56) References Cited

U.S. PATENT DOCUMENTS

| | | | |
|---|---|---|---|
| 4,978,870 A | 12/1990 | Chen et al. | |
| 5,506,524 A | 4/1996 | Lin | |
| 6,351,173 B1 | 2/2002 | Ovens et al. | |
| 6,373,753 B1 * | 4/2002 | Proebsting | ............... 365/189.09 |
| 6,433,583 B1 * | 8/2002 | Micheloni et al. | ............... 326/80 |
| 6,462,998 B1 * | 10/2002 | Proebsting | .................... 365/205 |
| 6,580,411 B1 | 6/2003 | Kubota et al. | |
| 7,352,209 B2 * | 4/2008 | Hsu et al. | ......................... 326/81 |
| 2006/0104123 A1 | 5/2006 | Razavi et al. | |
| 2008/0144399 A1 | 6/2008 | Cheung | |
| 2008/0157848 A1 | 7/2008 | Yeung | |
| 2012/0044009 A1 | 2/2012 | Hess | |
| 2014/0247081 A1 * | 9/2014 | Yeung et al. | .................. 327/333 |

FOREIGN PATENT DOCUMENTS

| | | |
|---|---|---|
| JP | H09-17179 | 1/1997 |
| JP | H09-93093 | 4/1997 |

OTHER PUBLICATIONS

GB Search Report dated Aug. 8, 2014 in GB 1402612.4, 22 pages.

* cited by examiner

*Primary Examiner* — Gene Auduong
(74) *Attorney, Agent, or Firm* — Pramudji Law Group PLLC; Ari Pramudji

(57) ABSTRACT

An integrated level shifting latch circuit receives an input signal in a first voltage domain and generates an output signal in a second voltage domain. Data retention circuitry operates in a transparent phase where a data value is subjected to a level shifting function and is written into the data retention circuitry dependent on the input signal. Control circuitry controls the data retention circuitry to operate in the transparent phase during a first phase of the clock signal and to operate in the latching phase during a second phase of the clock signal. Writing circuitry writes the data value into the data retention circuitry. Contention mitigation circuitry, during the transparent phase, reduces a voltage drop across at least one component within the data retention circuitry.

20 Claims, 8 Drawing Sheets

[PHASE 2 LEVEL SHIFT LATCH]

[PHASE 2 LEVEL SHIFT LATCH]

[TRANSPARENT PHASE (CK=0)]

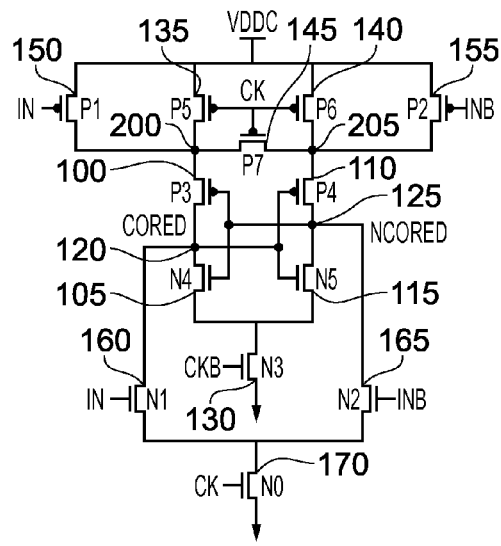
[PHASE 1 LEVEL SHIFT LATCH]
FIG. 6
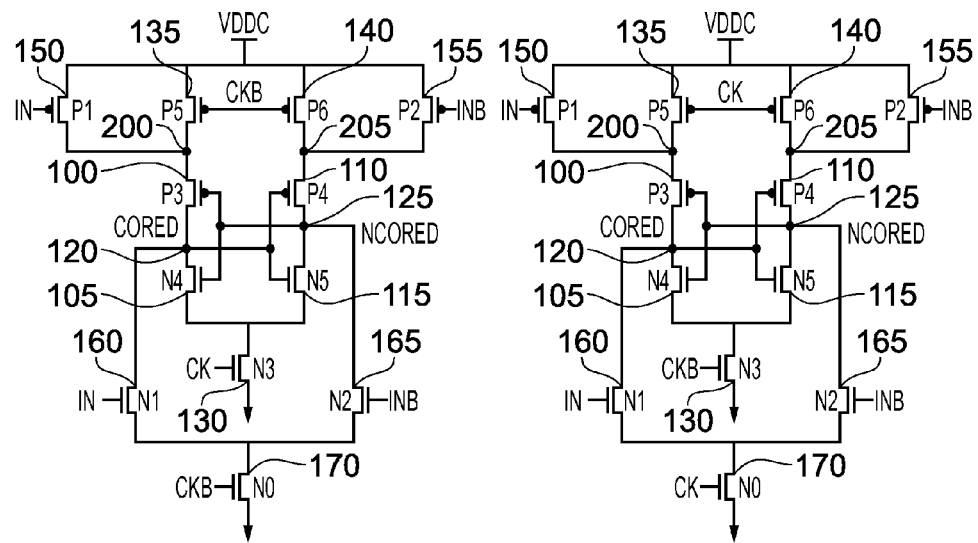
[PHASE 2 LEVEL SHIFT LATCH]
FIG. 7A
[PHASE 1 LEVEL SHIFT LATCH]
FIG. 7B Phase-2 level shift latch Phase-1 level shift latch

INTEGRATED LEVEL SHIFTING LATCH CIRCUIT AND METHOD OF OPERATION OF SUCH A LATCH CIRCUIT

BACKGROUND OF THE INVENTION

1. Field of the Invention

The present invention relates to an integrated level shifting latch circuit, and to a method of operation of such a latch circuit.

2. Description of the Prior Art

A level shifter circuit is used when there is a need to pass signals from one voltage domain to a different voltage domain. In modern data processing systems, it is becoming more and more common for certain parts of the data processing system to operate in a different voltage domain to one or more other parts. For example, a trend within integrated circuits is the increasingly common use of embedded memory, such as SRAM memory. With the reduction in size of process geometries, the individual memory cells within the memory are becoming less stable. To reduce the power consumption of the integrated circuit, it is desirable to reduce the operating voltage of the components within the integrated circuit. However, whilst this can be done for many of the components within the integrated circuit, including access logic circuitry associated with the memory device, it is often the case that a higher voltage is needed to drive the array of memory cells within the memory device in order to enhance the stability of those cells. Hence, embedded SRAM bit cells may use a higher voltage supply to guarantee state retention, whilst the rest of the system, including the access logic circuitry employed to access those bit cells within the memory device, may use a lower voltage supply to reduce power consumption. In order to maintain performance, and reduce switching power, level shifters are provided to pass signals between these domains.

Often, the signals generated in the lower voltage domain need to be latched before processing within the higher voltage domain. Hence, considering the example of a memory device, the various signals generated by the access logic circuitry in the lower voltage domain will often be latched using latch circuitry before further processing within the higher voltage domain containing the array of bit cells. It is common practice to first level shift such signals on the periphery of the lower voltage domain to the higher voltage domain, and then latch those signals in the higher voltage domain.

U.S. Pat. No. 4,978,870 describes a technique that uses a traditional level shifter followed by a separate latch circuit to enable input signals to be level shifted and then subsequently latched. One problem with such an approach is that the circuitry has a relatively large area and power consumption, due to the presence of the separate level shifter circuitry and subsequent latch circuitry. It would also be desirable to provide a higher performance solution.

U.S. Pat. No. 6,351,173 describes an integrated level shifting latch for an input/output section of an integrated circuit. With the circuit described in this patent, the voltage shifting range possible using the circuit depends on the sizing ratio of the NMOS and PMOS components within the design. As the extent of level shifting required increases, the latency involved in the shifting operation will increase and ultimately could result in failure of the circuitry. This is becoming more and more significant in modern data processing systems, where the difference in voltage between the lower voltage domain and the higher voltage domain can be as large as 400 mV when taking into account power supply tolerance variation and IR drop.

US 2012/0044009 A1 describes a level-shifting latch circuit. However, in the implementation described the latch is not clocked, and hence does not provide a true synchronous latch, as will be required in many implementations, such as at the interface between the access logic circuitry and the array of bit cells within a memory device. Also, the input is not gated by the clock, so any change in the input can impact on the "latched" state.

Commonly owned co-pending patent application US 2008/0157848 A1, the entire contents of which are hereby incorporated by reference, describes a level shifting circuit for use between voltage domains, which is able to operate efficiently for a large range of voltage difference between the lower voltage domain and the higher voltage domain. However, a separate latch circuit would need to be provided following such a level shifter circuit in order to perform the earlier mentioned level shifting and latch functionality.

It would be desirable to provide an integrated level shifting latch circuit which has improved performance, and is more area and power efficient, than providing a level shifting circuit followed by a separate latch circuit, but which can also accommodate an increased variation in voltage between the lower voltage domain and the higher voltage domain than known integrated solutions.

SUMMARY OF THE INVENTION

Viewed from a first aspect, the present invention provides an integrated level shifting latch circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said integrated level shifting latch circuit comprising: data retention circuitry operating in said second voltage domain and configured to operate in a transparent phase where a data value is subjected to a level shifting function and written into the data retention circuitry dependent on the input signal, and a latching phase where the data value written into the data retention circuitry during the transparent phase is retained irrespective of any change in the input signal during the latching phase, and that retained data value forms said output signal; control circuitry configured to receive a clock signal and to control the data retention circuitry to operate in said transparent phase during a first phase of the clock signal and to operate in said latching phase during a second phase of the clock signal; writing circuitry configured during the transparent phase to write said data value into said data retention circuitry by controlling a voltage of at least one internal node of the data retention circuitry dependent on the input signal; and contention mitigation circuitry configured to receive said input signal and, during said transparent phase, to reduce a voltage drop across at least one component within the data retention circuitry, thereby assisting said writing circuitry in altering the voltage of said at least one internal node during the transparent phase.

In accordance with the present invention, the data retention circuitry is able to perform a level shifting function as data is written into the data retention circuitry during a transparent phase of the latch. In one embodiment, this level shifting function is performed via an arrangement of components within the data retention circuitry that provides a feedback mechanism. However, the arrangement of components within the data retention circuitry means that the action of at least one component within the data retention circuitry acts against the action of the writing circuitry when the writing circuitry is seeking to alter the voltage on at least one internal node during the transparent phase. However, in accordance with the present invention, contention mitigation circuitry is used during the transparent phase to reduce a voltage drop across such a component, hence assisting the writing circuitry in altering the voltage of that at least one internal node.

Such an approach results in an integrated level shifting latch circuit that offers significant performance, power consumption and area saving benefits when compared with the traditional approach of providing a level shifting circuit followed by a separate latch circuit. Further, the integrated level shifting latch circuit of the present invention can operate efficiently even when there is a significant voltage difference between the first voltage domain and the second voltage domain.

The integrated level shifting latch circuit of the described embodiments is particularly beneficially used in situations where the second voltage domain is at a higher voltage than the first voltage domain, i.e. where a difference between the second voltage level and the common voltage level is higher than a difference between the first voltage level and the common voltage level.

The contention mitigation circuitry can be arranged in a variety of ways. However, in one embodiment the contention mitigation circuitry operates in the second voltage domain and, based on the input signal in said first voltage domain, presents a resistive path during said transparent phase which prevents a short circuit path occurring through the integrated level shifting latch circuit in the transparent phase. This arrangement hence protects the circuitry against potential short circuit paths occurring, whilst also assisting the writing circuitry in altering the voltage on at least one internal node during the transparent phase.

In one embodiment, the contention mitigation circuitry is connected between a first node and a second node, and a first portion of the control circuitry is connected in parallel with the contention mitigation circuitry between said first node and said second node. In the latching phase that first portion of said control circuitry connects the first and second nodes to thereby prevent operation of the contention mitigation circuitry during the latching phase. This provides a simple and effective mechanism for limiting the action of the contention mitigation circuitry to the transparent phrase, and hence avoiding any power being consumed by the contention mitigation circuitry during the latching phase.

In one embodiment, the second node comprises a first second node portion and a second second node portion, and in at least the transparent phase the first second node portion and the second second node portion are disconnected from each other to allow the voltage level at the first second node portion to differ from the voltage level at the second second node portion. This allows the contention mitigation circuitry to more readily reduce the voltage drop across the relevant component(s) within the data retention circuitry during the transparent phase.

Whilst in one embodiment, the first second node portion and the second second node portion may continue to be disconnected from each other in the latching phase, in an alternative embodiment the first portion of said control circuitry is configured during the latching phase to connect the first second node portion and the second second node portion. This can for example be achieved by including a transistor within the first portion of the control circuitry connected between the first second node portion and the second second node portion, and controlled by the clock signal so that the first second node portion and the second second node portion are disconnected from each other during the transparent phase, but are connected to each other during the latching phase. Such a transistor will provide an equalising function, by ensuring that the first second node portion and the second second node portion are both at the same voltage during the latching phase. This hence removes any effect that could arise from variation in other components of the first portion of the control circuitry, hence improving immunity of the circuitry to variation, and potentially improving yield.

The contention mitigation circuitry can take a variety of forms, but in one embodiment comprises first PMOS transistor circuitry connected between said first node and said first second node portion, and second PMOS transistor circuitry connected between said first node and said second second node portion.

The contention mitigation circuitry can also be placed at a variety of locations within the integrated level shifting latch circuit. In one embodiment, the contention mitigation circuitry is connected between the second voltage level and a first end of said data retention circuitry. However, in an alternative embodiment, the contention mitigation circuitry may be connected between internal nodes of the data retention circuitry. In some situations, this alternative approach can give rise to a better shut-off characteristic, hence further easing the task of the writing circuitry changing the voltage on the at least one internal node during the transparent phase.

In one particular configuration of this alternative approach, the data retention circuitry comprises a cross-coupled pair of inverters formed from PMOS transistors and NMOS transistors, and the contention mitigation circuitry is connected between the PMOS transistors and the NMOS transistors of said cross-coupled pair of inverters.

The data retention circuitry can take a variety of forms. In one embodiment, irrespective of where the contention mitigation circuitry is placed within the integrated level shifting latch circuit, the data retention circuitry comprises a cross-coupled pair of inverters formed from PMOS transistors and NMOS transistors, and the control circuitry is configured during said transparent phase to disable the NMOS transistors of said cross-coupled pair of inverters.

The first phase of the clock signal which places the data retention circuitry in the transparent phase and the second phase of the clock signal which places the data retention circuitry in the latching phase may vary dependent on implementation. For example, in one embodiment, the first phase of the clock signal is a logic 0 level, and the second phase of the clock signal is a logic 1 level, whilst in an alternative embodiment the first phase of the clock signal is a logic 1 level, and the second phase of the clock signal is a logic 0 level.

In one embodiment, the clock signal may be generated in the first voltage domain, whilst in an alternative embodiment the clock signal may be generated in the second voltage domain. In one embodiment, when the clock signal is generated in the second domain this allows a reduction in the stack sizes of the pull down components used to form the writing circuitry.

In one embodiment where the data retention circuitry comprises a cross-coupled pair of inverters formed from PMOS transistors and NMOS transistors, the at least one component which has its voltage drop reduced by the contention mitigation circuitry during the transparent phase is at least one of said PMOS transistors.

Viewed from a second aspect, the present invention provides a method of operating an integrated level shifting latch circuit configured to receive an input signal in a first voltage domain and generate an output signal in a second voltage domain, said first voltage domain operating with a first voltage supply providing a first voltage level and a common voltage level and said second voltage domain operating with a second voltage supply providing a second voltage level and said common voltage level, said method comprising: employing data retention circuitry operating in said second voltage domain to operate in a transparent phase where a data value is subjected to a level shifting function and written into the data retention circuitry dependent on the input signal, and a latching phase where the data value written into the data retention circuitry during the transparent phase is retained irrespective of any change in the input signal during the latching phase; outputting said retained data value as said output signal; controlling the data retention circuitry in dependence on a received clock signal to operate in said transparent phase during a first phase of the clock signal and to operate in said latching phase during a second phase of the clock signal; writing, during the transparent phase, said data value into said data retention circuitry by controlling a voltage of at least one internal node of the data retention circuitry dependent on the input signal; and employing contention mitigation circuitry, during said transparent phase, to reduce a voltage drop across at least one component within the data retention circuitry based on said input signal, thereby assisting said writing step in altering the voltage of said at least one internal node during the transparent phase.

Viewed from a third aspect, the present invention provides an integrated level shifting latch circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said integrated level shifting latch circuit comprising: data retention means for operating in said second voltage domain and for operating in a transparent phase where a data value is subjected to a level shifting function and written into the data retention means dependent on the input signal, and a latching phase where the data value written into the data retention means during the transparent phase is retained irrespective of any change in the input signal during the latching phase, and that retained data value forms said output signal; control means for receiving a clock signal and for controlling the data retention means to operate in said transparent phase during a first phase of the clock signal and to operate in said latching phase during a second phase of the clock signal; writing means for writing, during the transparent phase, said data value into said data retention means by controlling a voltage of at least one internal node of the data retention means dependent on the input signal; and contention mitigation means for receiving said input signal and, during said transparent phase, for reducing a voltage drop across at least one component within the data retention means, thereby assisting said writing means in altering the voltage of said at least one internal node during the transparent phase.

Viewed from a fourth aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device incorporating an integrated level shifting latch circuit in accordance with the first aspect of the present invention.

BRIEF DESCRIPTION OF THE DRAWINGS

The present invention will be described further, by way of example only, with reference to embodiments thereof as illustrated in the accompanying drawings, in which:

FIG. 6 illustrates an integrated level shifting latch circuit in accordance with an alternative embodiment;

FIGS. 7A and 7B illustrate integrated level shifting latch circuits in accordance with further alternative embodiments;

DESCRIPTION OF EMBODIMENTS

Figure 1:
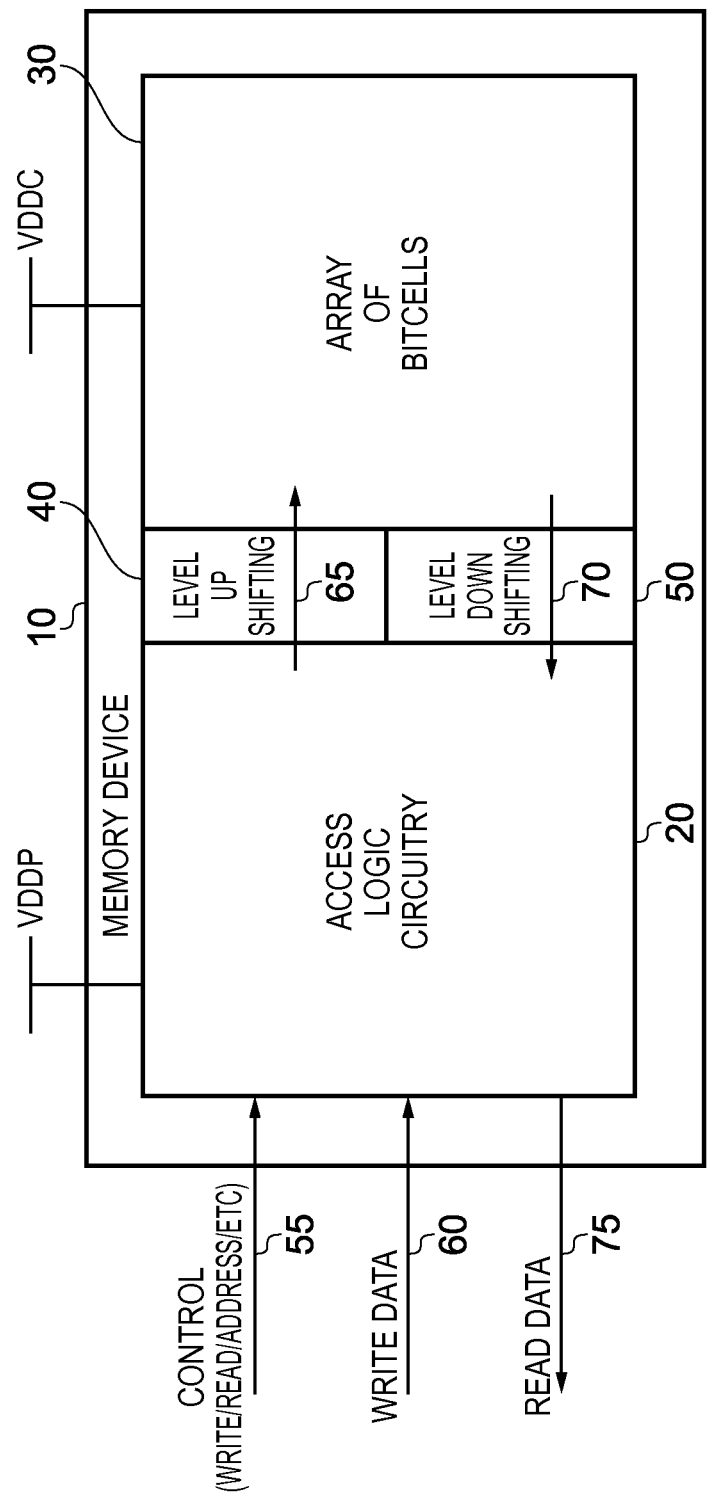
FIG. 1 is a block diagram of a memory device in accordance with a known arrangement.

FIG. 1 is a block diagram schematically illustrating a memory device 10 where the access logic circuitry 20 of the memory device is provided in a first voltage domain operating with a first voltage supply providing a first voltage level VDDP and a ground voltage level (not shown), whilst the array of bit cells 30 is provided in a second voltage domain operating with a second voltage supply providing a second voltage level VDDC and the ground voltage level. The second voltage level VDDC is higher than the first voltage level VDDP. This enables the access logic circuitry 20 to operate with a reduced power consumption, whilst the array of bit cells 30 is operated at a voltage level sufficient to guarantee state retention.

The access logic circuitry 20 will receive a number of control signals over path 55, these control signals identifying write transactions, read transactions, the addresses of those transactions, etc. It will also receive over path 60 write data for write transactions to be performed within the array of bit cells 30, and will output over path 75 the read data resulting from read transactions performed within the array of bit cells 30. As will be understood by those skilled in the art, the access logic circuitry 20 will include a number of components, such as address latches, various stages of word line decoding circuitry to decode the address in order to generate appropriate word line enable signals to activate addressed rows within the array of bit cells 30, write data path logic circuits used to control the voltages on the bit lines within the array of bit cells during a write operation, and various read data path logic circuits for processing the data read out of the array of bit cells in response to a read operation. Accordingly, for write operations, a number of signals will be generated for issuing to the array of bit cells 30 (these signals being schematically illustrated by the arrow 65 in FIG. 1. These signals will need to be subjected to a level up shifting function 40 in order to convert the voltage of those signals from the lower voltage domain to the higher voltage domain. Similarly, any data read out from the bit cells 30 over path 70 will need subjecting to a level down shifting function 50 in order to convert the voltage levels from the higher voltage domain to the lower voltage domain, before those signals are then subsequently processed by the access logic circuitry 20.

The level up shifting circuitry 40 is generally more problematic to implement than the level down shifting circuitry 50 (in fact in many instances no specific level down shifting circuitry may be required) since when performing level up shifting there is the potential for establishing various DC paths that can result in significant power consumption, and which may potentially create short circuit current paths. The integrated level shifting latch circuits of the subsequently described embodiments are particularly suitable for implementing the level up shifting function 40, whilst also being able to latch the resultant level shifted signal.

Figure 2:
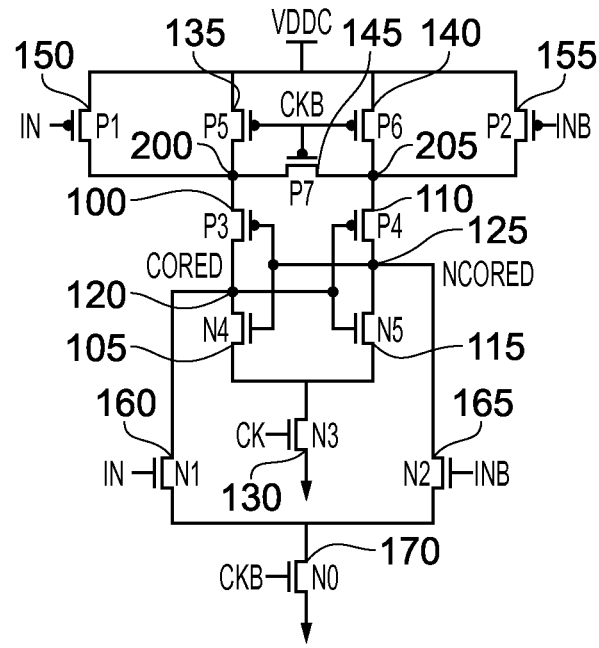
FIG. 2 illustrates an integrated level shifting latch circuit in accordance with one embodiment.

FIG. 2 schematically illustrates an integrated level shifting latch circuit in accordance with one embodiment. The arrangement of PMOS transistors and NMOS transistors within this circuit provide a number of functions. Firstly, a data retention circuit is formed by the PMOS transistors P3 100 and P4 110 in combination with the NMOS transistors N4 105 and N5 115. Due to the way in which these two PMOS and two NMOS transistors are interconnected, the data retention circuitry forms a cross-coupled pair of inverters. The data retention circuitry operates in the second voltage domain (i.e. the higher voltage domain) using the supply voltage VDDC and the ground voltage, and is configured to operate in a transparent phase where a data value may be written into the data retention circuitry by storing opposite logic values on the pair of internal nodes 120, 125, i.e. a logic one value at the node 120 and a logic zero value at the node 125, or alternatively a logic zero value at the node 120 and a logic one value at the node 125. What data value is written into the data retention circuit during the transparent phase will be dependent on the value of the input signal IN.

The data retention circuitry 100, 105, 110, 115 also performs a level shifting function as the data is written into it during the transparent phase of the latch. This level shifting function is performed due to the arrangement of components within the data retention circuitry providing a feedback mechanism, and enables the data retention circuit to perform efficient level shifting even when there is a relatively large difference between the lower and higher voltage domains.

Following the transparent phase, the data retention circuit enters a latching phase where the data value written into the data retention circuitry during the transparent phase is retained irrespective of any change in the input signal during the latching phase.

Control circuitry is formed by the three PMOS transistors 135, 140, 145 and the NMOS transistor N3 130. These transistors are operated in accordance with the clock signal CK and the inverted clock signal CKB, so as to control the data retention circuitry to operate in the transparent phase during a first phase of the clock signal and to operate in the latching phase during a second phase of the clock signal.

Figure 3:
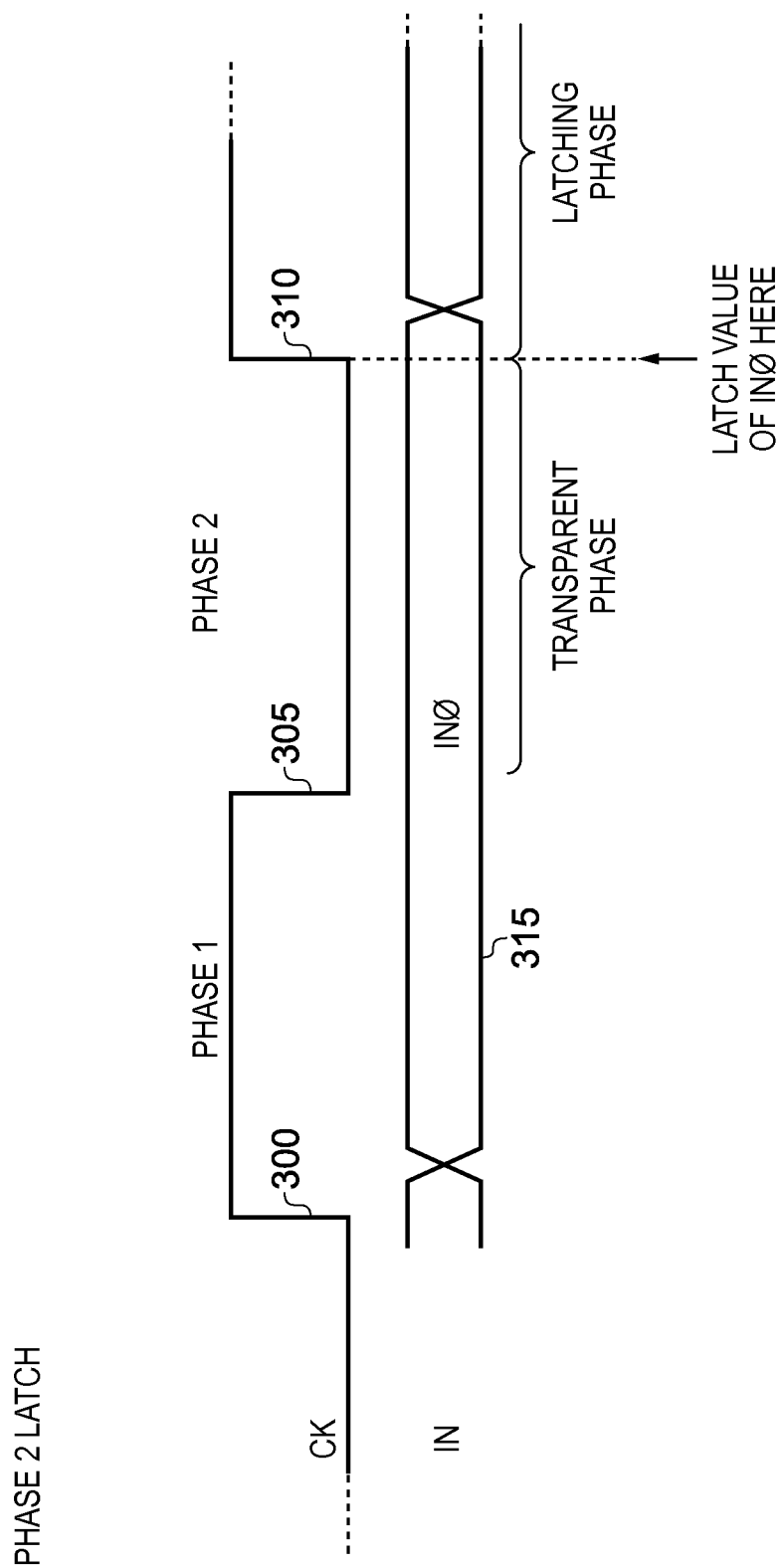
FIG. 3 schematically illustrates the transparent phase and latching phase of the circuitry of FIG. 2 in accordance with one embodiment.

In the particular configuration illustrated in FIG. 2, the circuit acts as a phase 2 level shift latch, such that the transparent phase and latching phase are as shown in FIG. 3. In particular, on a rising edge of the clock signal 300, a change in the input data is triggered, such that shortly following that rising clock edge the input data transitions to the value IN0 315. Following the high phase of the clock signal, the clock transitions at point 305 to the logic zero level, this initiating the transparent phase of the latch of FIG. 2. During this period, the internal nodes 120, 125 of the data retention circuit are updated dependent on the value of the input data IN0. On the subsequent rising edge 310, the data retention circuit then enters the latching phase, where the value of IN0 at point 310 is then retained within the data retention circuit, and provided as the output signal formed by one of the signals CORED and the inverted version of CORED (labelled NCORED in FIG. 2).

Returning to FIG. 2, the two NMOS transistors N1 160 and N2 165, in combination with the NMOS transistor N0 170, form writing circuitry. In particular, during the transparent phase when the clock signal is low (and CKB is hence high), the NMOS transistor N0 170 is turned on, activating the NMOS transistors N1 160 and N2 165 such that the voltage at the internal nodes 120, 125 is adjusted as necessary dependent on the input signal IN and the inverted version of the input signal INB.

However, the earlier discussed feedback arrangement of components within the data retention circuitry means that the action of one of the PMOS components 100, 110 within the data retention circuitry will act to resist the action of the writing circuitry when the writing circuitry is seeking to alter the voltage on at least one internal node during the transparent phase.

To alleviate this problem, contention mitigation circuitry is employed in accordance with the embodiment of FIG. 2. In particular, as shown in FIG. 2, the contention mitigation circuitry is provided by the PMOS transistors P1 150 and P2 155 which are arranged to receive the input signal IN and the inverted input signal INB, respectively. As will be discussed in more detail later, during the transparent phase, the contention mitigation circuitry reduces a voltage drop across one of the PMOS transistors P3 100 and P4 110 within the data retention circuit so as to assist the NMOS transistors N1 160 and N2 165 within the writing circuitry in altering the voltage on the internal nodes 120, 125 of the data retention circuit in situations where the input data IN requires the voltage on those nodes to be flipped.

Figure 4A:
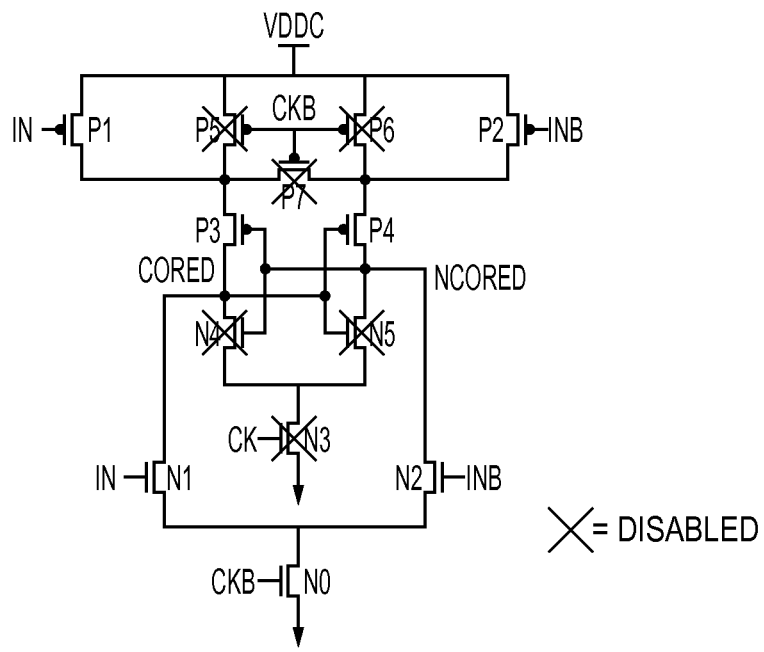
FIGS. 4A and 4B illustrate the operation of the integrated level shifting latch circuit of FIG. 2 in the transparent phase and latching phase, respectively, in accordance with one embodiment.

FIG. 4A schematically illustrates which components of the circuitry of FIG. 2 are disabled during the transparent phase, in this embodiment the transparent phase occurring whilst the clock signal CK is at the logic zero level. Since the clock signal CK is at a logic zero level, this will disable the transistor N3 130, which in turn will disable the two NMOS transistors N4 105 and N5 115 within the data retention circuitry. Further, since the inverted clock signal CKB will be at the logic one level, this will effectively disable the three PMOS transistors P5 135, P6 140 and P7 145 within the control circuitry.

It should be noted that the input signals IN and INB are generated in the lower voltage domain. In one embodiment, the clock signals CK and CKB are also generated in this lower voltage domain. In that event, it should be noted that the logic one value of the CKB signal generated in the lower voltage domain will not fully turn off the PMOS transistors P5 135, P6 140 and P7 145, but they are typically turned off sufficiently to have no significant effect on the operation of this circuitry in the transparent phase. In an alternative embodiment, the clock signal CK and its inverted version CKB are actually generated in the higher VDDC voltage domain, and hence the PMOS transistors 135, 140 and 145 will be fully turned off. This allows the size of the NMOS transistors N1

160, N2 165 and N0 170 to be further reduced relative to the embodiment where the clock signals are generated in the lower voltage domain.

Figure 4B:
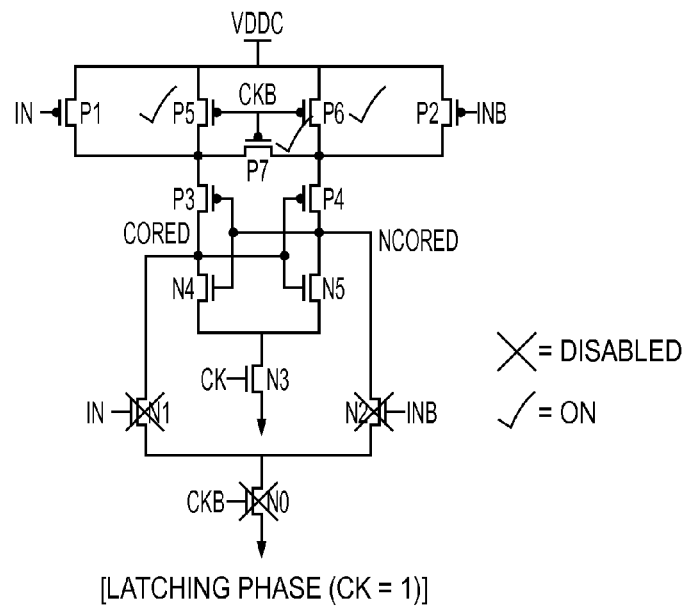

FIG. 4B shows the latching phase of the circuitry of FIG. 2. The latching phase occurs when the clock signal CK is at the logic one level, and accordingly the inverted block signal CKB will be at the logic zero level. This causes the NMOS transistor N0 170 to be turned off, thereby also disabling the two NMOS transistors N1 160 and N2 165. Conversely, because the inverted clock signal CKB is at the logic zero level, this will turn on the three PMOS transistors 135, 140, 145, thereby preventing operation of the contention mitigation circuitry 150, 155 during the latching phase.

Figures 5A, 5B:
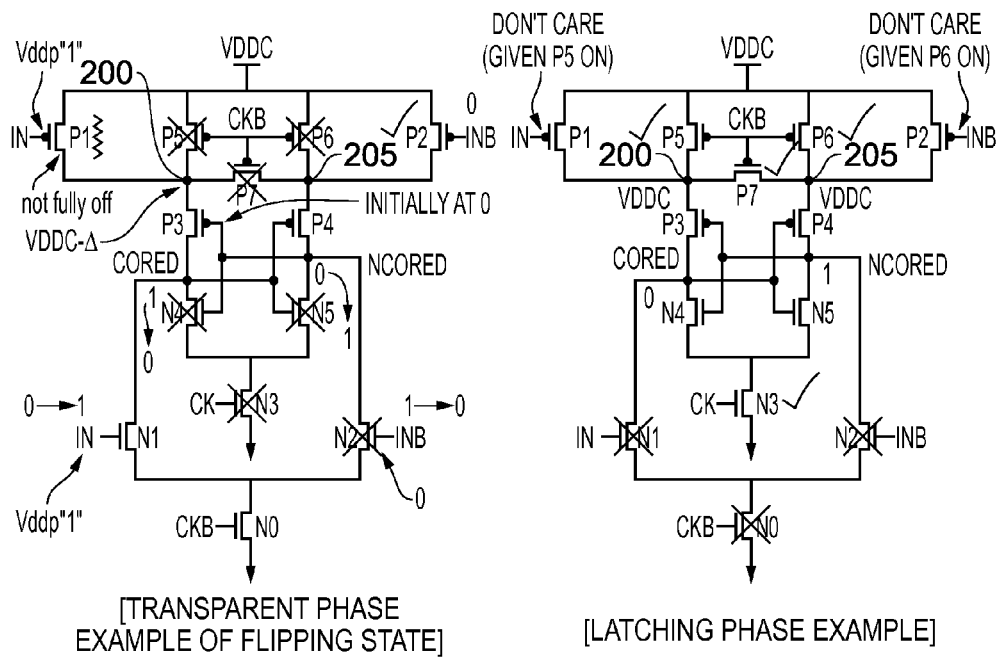
FIGS. 5A and 5B provide a specific example of the operation of the integrated level shifting latch circuit of FIG. 2 in both the transparent phase and the latching phase.

The operation of the circuitry of FIG. 2 will now be illustrated further with reference to a specific example, as shown schematically in FIGS. 5A and 5B. In this example, as shown in FIG. 5A, it is assumed that at the beginning of the transparent phase, the node 120 stores a logic one level, and the node 125 stores a logic zero level. However, during the transparent phase, the input signal IN transitions from the logic zero to the logic one level in the lower voltage domain, and conversely the inverted input signal INB transitions from the logic one level to the logic zero level. As discussed earlier with reference to FIG. 4A, during the transparent phase the transistors N3 130, N4 105, N5 115, P5 135, P6 140 and P7 145 are all turned off. In addition, when the value of INB transitions to the logic zero level this also turns off the NMOS transistor N2 165.

As the input value IN transitions to the logic one level, this will turn on the NMOS transistor 160, to cause that NMOS transistor to start to discharge the voltage on the node 120 towards the logic zero level (it being noted that the CKB signal is also at the logic one level, hence turning on the NMOS transistor N0 170). However, it should be noted that the NMOS transistors N1 160 and N0 170 will not be fully turned on, due to the signals INB and CKB being generated in the lower voltage domain (in an alternative embodiment the transistor N0 170 will be fully turned on if the clock signal is generated in the higher voltage domain, but even in that embodiment the input signal will have been generated in the lower voltage domain and accordingly the transistor N1 160 will not be fully turned on).

In the specific example illustrated in FIG. 5A, it will be seen that initially the input to the PMOS transistor P3 100 will be at a logic zero level, and accordingly this PMOS transistor will be strongly turned on, and will be seeking to pull the node 120 towards the logic one level. Accordingly, this causes some contention, since the action of the NMOS transistor N1 160 has to overcome the opposite action of the PMOS transistor P3 100.

To assist in this process, the contention mitigation circuitry 150, 155 is deployed in the transparent phase. In particular, whilst the PMOS transistor P2 155 is fully turned on via the logic zero value INB, the PMOS transistor P1 150 is not fully turned off by the input signal IN being at the logic one value of the lower voltage domain VDDP. This hence creates a resistive path through the PMOS transistor P1 150, causing an effective drop in voltage at the node 200 to which the PMOS transistor P3 100 is connected. This reduces the voltage drop across the PMOS transistor P3 100, and accordingly weakens the operation of that PMOS transistor, assisting the NMOS transistor N1 160 in overcoming the action of the PMOS transistor P3 100.

Whilst this temporarily creates a DC current path through the transistors P1 150, P3 100, N1 160 and N0 170, this DC path is relatively short lived, and as soon as the state is flipped, the PMOS transistor P3 100 will be strongly turned off, removing that DC path.

The circuit then enters the latching phase as shown in FIG. 5B. As discussed earlier, the three PMOS transistors P5 135, P6 140 and P7 145 are strongly turned on at this point, and hence connect the nodes 200, 205 to the high voltage supply VDDC. This effectively deactivates the operation of the contention mitigation circuitry 150, 155. Since the transistors N1 160, N2 165 and N0 170 are disabled in this phase, no changes in the input signal can effect the data stored within the data retention circuitry, and accordingly the data value is safely latched at the high voltage domain, with the CORED output being at a logic zero level, and the NCORED output being at a logic one value in the high voltage domain.

Whilst the circuitry of FIG. 2 shows a phase 2 level shifting latch, the same circuitry can be readily used to provide a phase one level shifting latch merely by flipping the clock inputs, so that all of the components that previously received the clock signal CK now receive the clock signal CKB, and all of the components that previously received the signal CKB now receive the clock signal CK. Such an arrangement is shown in FIG. 6. Accordingly, when using the circuitry of FIG. 6, the transparent phase occurs during the logic one level of the clock signal, and the latching phase occurs during the logic zero phase of the clock signal.

In FIGS. 2 and 6, the PMOS transistor P7 145 provides an equalising function, by ensuring that the nodes 200, 205 are both at exactly the same voltage during the latching phase. This hence removes any effect that could arise from variation in the PMOS transistors P5 135 and P6 140. This hence improves immunity of the circuitry to variation, and hence potentially improves yield.

However, the inclusion of the PMOS transistor P7 145 adds to the load on the clock signal path. In many situations it is desirable to reduce as much as possible the capacitance on the clock signal path, and accordingly in an alternative embodiment the PMOS transistor P7 145 can be omitted. FIG. 7A illustrates the resultant circuitry that could be used to form an alternative embodiment to the circuitry of FIG. 2, hence providing a phase two level shifting latch. Similarly, FIG. 7B illustrates the resultant circuitry that could be used instead of the circuitry of FIG. 6 to provide a phase one level shifting latch.

Figure 8A:
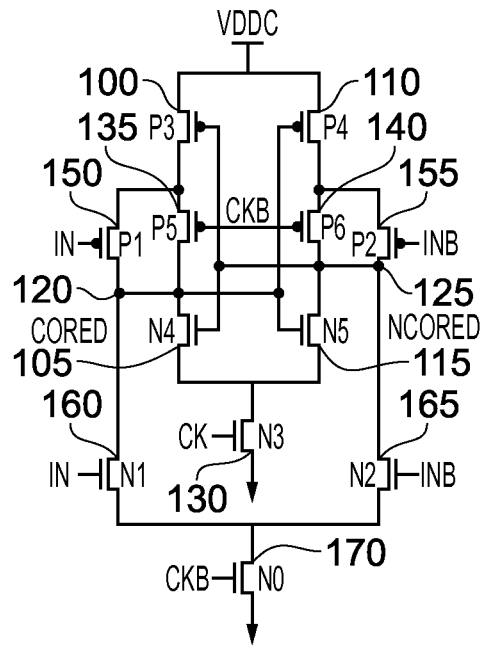
FIGS. 8A and 8B illustrate integrated level shifting latch circuits in accordance with yet further alternative embodiments.

Whilst in the previously described embodiments, the contention mitigation circuitry, and the portion of the control circuitry formed by the PMOS transistors 135, 140, 145, are located between the high voltage supply VDDC and one end of the data retention circuitry, it is not essential to arrange the components in this way. In particular, FIG. 8A illustrates an alternative version of the circuitry of FIG. 7A, where the earlier mentioned contention mitigation and control circuitry components are placed between the PMOS transistors P3 100, P4 110 and the NMOS transistors N4 105, N5 115 of the data retention circuitry. The operation of the circuitry is identical to that discussed earlier with reference to the first embodiment of FIG. 2 (other than the absence of the equalising PMOS transistor P7 145). However, it has been found that in some implementations, for example implementations where body effects may be present within the transistors, this arrangement can provide a better shut off characteristic, making it even easier for the writing circuitry to flip the internal state of the data retention device during the transparent phase of operation.

Figure 8B:
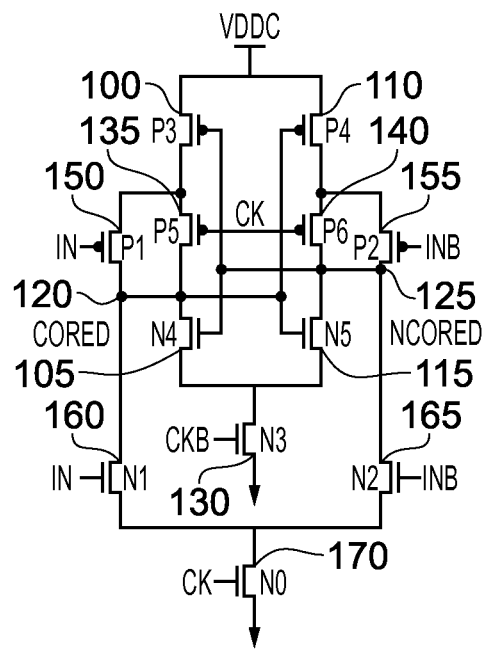

Similarly, FIG. 8B illustrates an analogous arrangement that can be used to provide a phase one level shifting latch, and again the only difference between FIG. 8B and FIG. 8A is that the clock signals have been reversed.

Figure 9:
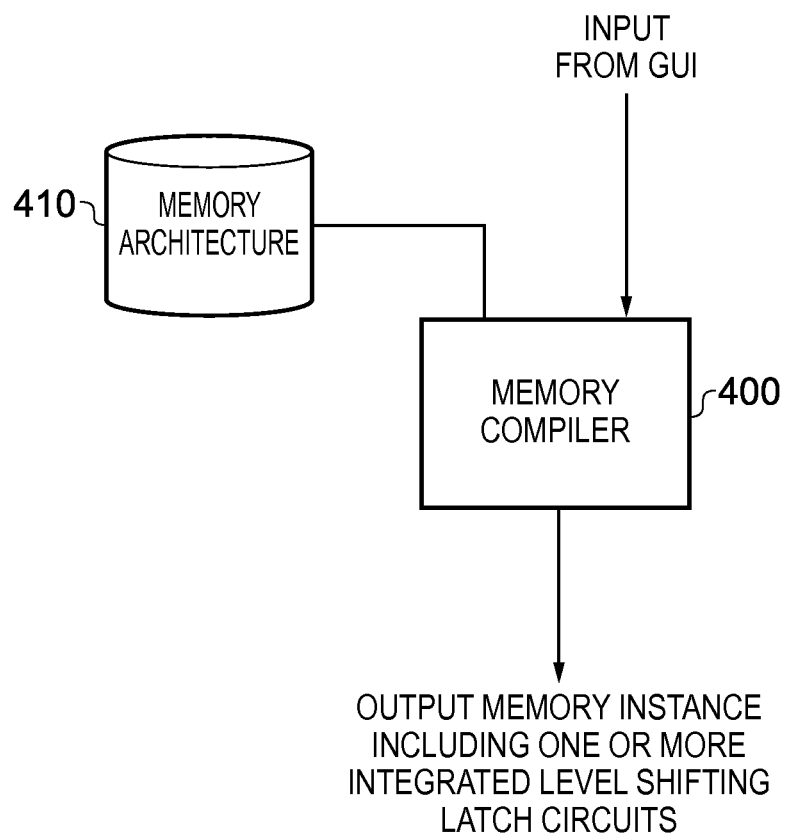
FIG. 9 is a diagram schematically illustrating the operation of a memory compiler to generate a memory instance including one or more integrated level shifting latch circuits of the described embodiments.

FIG. 9 schematically illustrates how a memory instance including one or more integrated level shifting latch circuits in accordance with the above described embodiments may be created from a memory compiler 400 with reference to a memory architecture 410. The memory architecture 410 specifies a definition of circuit elements and data defining rules for combining those circuit elements in order to create a memory instance. Particular requirements for the memory instance are entered into the memory compiler 400 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 400 then generates the required memory instance based on the input parameters and the memory architecture 410. In accordance with one embodiment, the memory compiler includes one or more integrated level shifting latch circuits between the access logic circuitry and the array of bit cells within the memory device, each integrated level shifting latch circuit having the form described with reference to the earlier figures.

Figure 10:
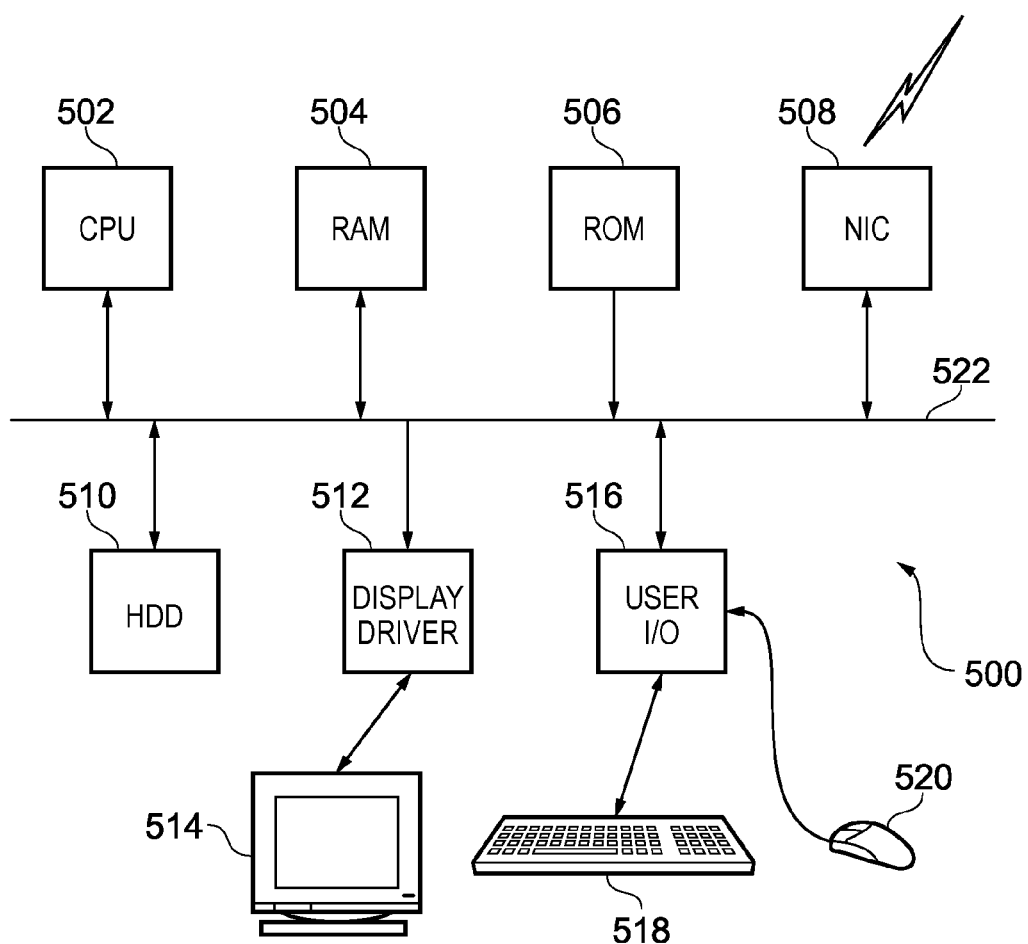
FIG. 10 is a diagram of a computer system on which a memory compiler operation may be performed to generate a memory instance conforming to the above described embodiments.

FIG. 10 schematically illustrates a general purpose computer 500 of the type that may be used to implement the above described memory compilation operation in order to generate a memory instance. The general purpose computer 500 includes a central processing unit 502, a random access memory 504, a read only memory 506, a network interface card 508, a hard disk drive 510, a display driver 512 and monitor 514 and a user input/output circuit 516 with a keyboard 518 and mouse 520 all connected via a common bus 522. In operation the central processing unit 502 will execute computer program instructions that may be stored in one or more of the random access memory 504, the read only memory 506 and the hard disk drive 510 or dynamically downloaded via the network interface card 508. The results of the processing performed may be displayed to a user via the display driver 512 and the monitor 514. User inputs for controlling the operation of the general purpose computer 500 may be received via the user input output circuit 516 from the keyboard 518 or the mouse 520 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 500. When operating under control of an appropriate computer program, the general purpose computer 500 can perform the above described memory compiler operation and can be considered to form an apparatus for performing the above described memory compiler operation. The architecture of the general purpose computer 500 could vary considerably and FIG. 10 is only one example.

From the above described embodiments, it will be appreciated that such embodiments provide an integrated level shifting latch circuit that has better performance and is more area and power efficient than using a separated input level shifter followed by an input latch. In addition, the circuit is able to cope with relatively large differences in the two voltage domains without introducing significant latency, and whilst ensuring correct operation.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. An integrated level shifting latch circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said integrated level shifting latch circuit comprising:
   data retention circuitry operating in said second voltage domain and configured to operate in a transparent phase where a data value is subjected to a level shifting function and written into the data retention circuitry dependent on the input signal, and a latching phase where the data value written into the data retention circuitry during the transparent phase is retained irrespective of any change in the input signal during the latching phase, and that retained data value forms said output signal;
   control circuitry configured to receive a clock signal and to control the data retention circuitry to operate in said transparent phase during a first phase of the clock signal and to operate in said latching phase during a second phase of the clock signal;
   writing circuitry configured during the transparent phase to write said data value into said data retention circuitry by controlling a voltage of at least one internal node of the data retention circuitry dependent on the input signal; and
   contention mitigation circuitry configured to receive said input signal and, during said transparent phase, to reduce a voltage drop across at least one component within the data retention circuitry, thereby assisting said writing circuitry in altering the voltage of said at least one internal node during the transparent phase.

2. An integrated level shifting latch circuit as claimed in claim 1, wherein a difference between said second voltage level and said common voltage level is higher than a difference between said first voltage level and said common voltage level.

3. An integrated level shifting latch circuit as claimed in claim 2, wherein said contention mitigation circuitry operates in said second voltage domain and, based on the input signal in said first voltage domain, presents a resistive path during said transparent phase which prevents a short circuit path occurring through the integrated level shifting latch circuit in the transparent phase.

4. An integrated level shifting latch circuit as claimed in claim 1, wherein said level shifting function is performed via an arrangement of components within the data retention circuitry that provides a feedback mechanism.

5. An integrated level shifting latch circuit as claimed in claim 1, wherein:
   said contention mitigation circuitry is connected between a first node and a second node;
   a first portion of said control circuitry is connected in parallel with said contention mitigation circuitry between said first node and said second node, in the latching phase said first portion of said control circuitry connecting the first and second nodes to thereby prevent operation of the contention mitigation circuitry during said latching phase.

6. An integrated level shifting latch circuit as claimed in claim 5, wherein said second node comprises a first second node portion and a second second node portion, in at least said transparent phase the first second node portion and the second second node portion being disconnected from each other to allow the voltage level at the first second node portion to differ from the voltage level at the second second node portion.

7. An integrated level shifting latch circuit as claimed in claim 6, wherein said first portion of said control circuitry is configured during said latching phase to connect the first second node portion and the second second node portion.

8. An integrated level shifting latch circuit as claimed in claim 6, wherein said contention mitigation circuitry comprises first PMOS transistor circuitry connected between said first node and said first second node portion, and second PMOS transistor circuitry connected between said first node and said second second node portion.

9. An integrated level shifting latch circuit as claimed in claim 1, wherein said contention mitigation circuitry is connected between said second voltage level and a first end of said data retention circuitry.

10. An integrated level shifting latch circuit as claimed in claim 1, wherein said contention mitigation circuitry is connected between internal nodes of the data retention circuitry.

11. An integrated level shifting latch circuit as claimed in claim 10, wherein said data retention circuitry comprises a cross-coupled pair of inverters formed from PMOS transistors and NMOS transistors, and the contention mitigation circuitry is connected between the PMOS transistors and the NMOS transistors of said cross-coupled pair of inverters.

12. An integrated level shifting latch circuit as claimed in claim 1, wherein;
    said data retention circuitry comprises a cross-coupled pair of inverters formed from PMOS transistors and NMOS transistors; and
    said control circuitry is configured during said transparent phase to disable the NMOS transistors of said cross-coupled pair of inverters.

13. An integrated level shifting latch circuit as claimed in claim 1, wherein said first phase of the clock signal is a logic 0 level, and said second phase of the clock signal is a logic 1 level.

14. An integrated level shifting latch circuit as claimed in claim 1, wherein said first phase of the clock signal is a logic 1 level, and said second phase of the clock signal is a logic 0 level.

15. An integrated level shifting latch circuit as claimed in claim 1, wherein said clock signal is generated in said first voltage domain.

16. An integrated level shifting latch circuit as claimed in claim 1, wherein said clock signal is generated in said second voltage domain.

17. An integrated level shifting latch circuit as claimed in claim 1, wherein said data retention circuitry comprises a cross-coupled pair of inverters formed from PMOS transistors and NMOS transistors, and said at least one component which has its voltage drop reduced by the contention mitigation circuitry during said transparent phase is at least one of said PMOS transistors.

18. A method of operating an integrated level shifting latch circuit configured to receive an input signal in a first voltage domain and generate an output signal in a second voltage domain, said first voltage domain operating with a first voltage supply providing a first voltage level and a common voltage level and said second voltage domain operating with a second voltage supply providing a second voltage level and said common voltage level, said method comprising:
    employing data retention circuitry operating in said second voltage domain to operate in a transparent phase where a data value is subjected to a level shifting function and written into the data retention circuitry dependent on the input signal, and a latching phase where the data value written into the data retention circuitry during the transparent phase is retained irrespective of any change in the input signal during the latching phase;
    outputting said retained data value as said output signal;
    controlling the data retention circuitry in dependence on a received clock signal to operate in said transparent phase during a first phase of the clock signal and to operate in said latching phase during a second phase of the clock signal;
    writing, during the transparent phase, said data value into said data retention circuitry by controlling a voltage of at least one internal node of the data retention circuitry dependent on the input signal; and
    employing contention mitigation circuitry, during said transparent phase, to reduce a voltage drop across at least one component within the data retention circuitry based on said input signal, thereby assisting said writing step in altering the voltage of said at least one internal node during the transparent phase.

19. An integrated level shifting latch circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said integrated level shifting latch circuit comprising:
    data retention means for operating in said second voltage domain and for operating in a transparent phase where a data value is subjected to a level shifting function and written into the data retention means dependent on the input signal, and a latching phase where the data value written into the data retention means during the transparent phase is retained irrespective of any change in the input signal during the latching phase, and that retained data value forms said output signal;
    control means for receiving a clock signal and for controlling the data retention means to operate in said transparent phase during a first phase of the clock signal and to operate in said latching phase during a second phase of the clock signal;
    writing means for writing, during the transparent phase, said data value into said data retention means by controlling a voltage of at least one internal node of the data retention means dependent on the input signal; and
    contention mitigation means for receiving said input signal and, during said transparent phase, for reducing a voltage drop across at least one component within the data retention means, thereby assisting said writing means in altering the voltage of said at least one internal node during the transparent phase.

20. A non-transitory, computer-readable program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device incorporating an integrated level shifting latch circuit as claimed in claim 1.

* * * * *